(12) United States Patent
Shearman et al.

(10) Patent No.: US 10,104,799 B2
(45) Date of Patent: Oct. 16, 2018

(54) NETWORK ELEMENT CHASSIS TOOL AND METHOD FOR SINGLE PERSON INSTALLATION

(71) Applicant: Ciena Corporation, Hanover, MD (US)

(72) Inventors: Simon John Edward Shearman, Almonte (CA); Warren Odd Johnsen, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 15/044,170

(22) Filed: Feb. 16, 2016

(65) Prior Publication Data
US 2017/0238438 A1    Aug. 17, 2017

(51) Int. Cl.
*H05K 7/14*    (2006.01)

(52) U.S. Cl.
CPC .................. *H05K 7/1489* (2013.01)

(58) Field of Classification Search
CPC .... H05K 7/1489; H05K 7/1421; A47B 88/10; A47B 88/0466; A47B 96/06; A47B 88/16; A47B 88/04; A47B 88/0085
USPC ............. 312/334.4, 334.5; 211/26, 183, 26.2
See application file for complete search history.

(56) References Cited

U.S. PATENT DOCUMENTS

| | | | |
|---|---|---|---|
| 6,173,848 B1 | 1/2001 | Bravo | |
| 6,230,903 B1 * | 5/2001 | Abbott | H05K 7/1421 211/190 |
| 6,422,399 B1 * | 7/2002 | Castillo | A47B 57/40 211/175 |
| 6,554,142 B2 * | 4/2003 | Gray | A47B 57/30 211/175 |
| 6,615,992 B1 * | 9/2003 | Lauchner | H05K 7/1489 211/175 |
| 6,644,481 B2 * | 11/2003 | Dean | H05K 7/1489 211/190 |
| 6,655,534 B2 * | 12/2003 | Williams | H05K 7/183 211/190 |
| 6,666,340 B2 * | 12/2003 | Basinger | H05K 7/1489 211/175 |
| 6,681,942 B2 * | 1/2004 | Haney | A47B 88/044 211/183 |
| 6,948,691 B2 * | 9/2005 | Brock | A47B 88/044 211/175 |
| 6,948,968 B1 | 9/2005 | Shearman et al. | |
| 6,974,037 B2 * | 12/2005 | Haney | A47B 88/044 211/183 |
| 7,042,716 B2 | 5/2006 | Shearman | |
| 7,134,558 B1 * | 11/2006 | Mimlitch, III | A47B 47/024 211/189 |

(Continued)

*Primary Examiner* — Kimberly T Wood
(74) *Attorney, Agent, or Firm* — Clements Bernard Walker PLLC; Christopher L. Bernard; Lawrence A. Baratta, Jr.

(57) ABSTRACT

A support system for a single person installation of a network element chassis in a rack with a plurality of posts includes a plurality of supporting "L" brackets each including a horizontal side adapted to support the network element chassis and a vertical side; a plurality of support mounting brackets each including two ends and each slidably connectable to the vertical side of a supporting "L" bracket based on positioning of the plurality of posts in the rack; and a plurality of rack mount brackets each connectable to one of the two ends and adapted to connect to holes in a post on the rack.

16 Claims, 12 Drawing Sheets

(56) References Cited

U.S. PATENT DOCUMENTS

| | | | | |
|---|---|---|---|---|
| 7,357,362 B2 * | 4/2008 | Yang | A47B 88/044 | 248/220.22 |
| 7,699,279 B2 * | 4/2010 | Chen | A47B 88/044 | 248/220.22 |
| 7,740,329 B2 * | 6/2010 | Hsiung | H05K 7/1489 | 312/223.1 |
| 7,798,582 B2 * | 9/2010 | Yu | A47B 88/044 | 211/26 |
| 7,857,145 B2 * | 12/2010 | Mushan | A47B 88/044 | 211/26 |
| 7,866,488 B2 * | 1/2011 | Mimlitch, III | A47B 47/024 | 211/26 |
| 8,083,298 B2 * | 12/2011 | Henderson | H05K 7/1489 | 211/26 |
| 8,235,339 B2 * | 8/2012 | Selvidge | A47B 96/06 | 211/175 |
| 8,356,718 B2 * | 1/2013 | Yang | H05K 7/1489 | 211/26 |
| 8,371,454 B2 * | 2/2013 | Chen | A47B 88/044 | 211/26 |
| 8,562,086 B1 * | 10/2013 | Baik | H05K 7/1489 | 312/223.1 |
| 8,616,382 B2 * | 12/2013 | Liang | G06F 1/183 | 211/26 |
| 8,755,192 B1 | 6/2014 | Schrempp et al. | | |
| 2001/0040142 A1 * | 11/2001 | Haney | A47B 88/044 | 211/183 |
| 2003/0019824 A1 * | 1/2003 | Gray | A47B 57/30 | 211/26 |
| 2003/0136749 A1 * | 7/2003 | Williams | H05K 7/183 | 211/26 |
| 2003/0205539 A1 * | 11/2003 | Lauchner | H05K 7/1489 | 211/26 |
| 2007/0120386 A1 | 5/2007 | Benysh et al. | | |
| 2008/0067907 A1 * | 3/2008 | Chen | A47B 88/044 | 312/312 |
| 2009/0250421 A1 * | 10/2009 | Wang | A47B 88/044 | 211/183 |
| 2010/0243586 A1 * | 9/2010 | Henderson | H05K 7/1489 | 211/26.2 |
| 2012/0018605 A1 * | 1/2012 | Lacarra | H05K 7/1489 | 248/224.8 |
| 2013/0056432 A1 * | 3/2013 | Lin | H05K 7/1489 | 211/123 |
| 2013/0161277 A1 | 6/2013 | Augsburger et al. | | |
| 2015/0090677 A1 * | 4/2015 | Shao | H05K 7/1489 | 211/26 |
| 2015/0122752 A1 | 5/2015 | Shen et al. | | |
| 2015/0136722 A1 * | 5/2015 | Chen | H05K 7/1489 | 211/175 |
| 2015/0181753 A1 * | 6/2015 | Murakami | H05K 7/1489 | 211/26 |

* cited by examiner

NETWORK ELEMENT CHASSIS TOOL AND METHOD FOR SINGLE PERSON INSTALLATION

FIELD OF THE DISCLOSURE

The present disclosure generally relates to networking hardware systems and methods. More particularly, the present disclosure relates to a network element chassis tool and method for a single person installation.

BACKGROUND OF THE DISCLOSURE

Networking and computer equipment, such as switches, gateways, routers, bridges, servers, multilayer switches, firewalls, controllers, optical equipment, and the like, is deployed in various locations, such as Central Offices (CO), Data Centers, and the like, in rack-mounted physical configurations. That is, physical chassis are fixedly mounted in racks, frames, cabinets, etc. (collectively referred to herein as "rack" or "racks"). Installation can require more than one installation personnel. Specifically, physically mounting a chassis to a rack requires one person to hold the chassis while the other performs the mounting. In the past, chassis were much larger and often shipped to a site factory-mounted in the rack. As chassis get smaller, e.g., 1-2 Rack Unit (RU) sized chassis, it is inefficient to have multiple installation personnel on-site.

Smaller chassis have been known in the art, typically in datacenters. However, datacenter chassis are usually mounted on rails that allow single person installation. With Data and Telecom environment convergence, equipment is designed to work in both Telecom environments and Datacenter environments, so chassis must be mountable in racks that do not support mounting rails. As chassis get deeper and heavier, they can no longer be supported by one hand as the other hand screws in fasteners. Deeper and heavier chassis must be supported at the front and rear of a mounting rack because the center of gravity has moved too far from the front mounting flanges. In such a configuration, one installer must support the rear of the chassis while the front is fastened to the front uprights by another installer.

It would be advantageous to provide a network element chassis tool and method for a single person installation. It would further be advantageous to provide such tool to support variability associated with different rack types in the field.

BRIEF SUMMARY OF THE DISCLOSURE

In an exemplary embodiment, a support system for a single person installation of a network element chassis in a rack with a plurality of posts includes a plurality of supporting "L" brackets each including a horizontal side adapted to support the network element chassis and a vertical side; a plurality of support mounting brackets each including two ends and each slidably connectable to the vertical side of a supporting "L" bracket based on positioning of the plurality of posts in the rack; and a plurality of rack mount brackets each connectable to one of the two ends and adapted to connect to holes in a post on the rack. The rack can include one of two posts and four posts, and the plurality of rack mount brackets can be connected to the two ends based on a number of posts in the rack. The support system can be connected to the rack, the network element chassis can be placed on the horizontal side of each of the plurality of supporting "L" brackets, and the network element chassis can be connected to the posts. All connections between the plurality of supporting "L" brackets, the plurality of support mounting brackets, the plurality of rack mount brackets, and the rack can be performed without tools.

The plurality of supporting "L" brackets, the plurality of support mounting brackets, and the plurality of rack mount brackets can be connectable to one another to form a rectangular brick for transport of the support system. The rack mount brackets can include mounting posts which are adjustable based on hole spacing in the plurality of posts in the rack. The mounting posts can include a tapered pin and a square base, wherein the tapered pin is adapted to engage a circular shaped hole in the plurality of posts with variable size, and the square base is adapted to engage a cage nut hole in the plurality of posts. The plurality of support mounting brackets can be adjustable to the supporting "L" bracket based on a width of the plurality of posts in the rack. The rack can include any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

In another exemplary embodiment, a method using a support system for a single person installation of a network element chassis in a rack with a plurality of posts includes connecting a supporting "L" bracket to a plurality of support mounting brackets, wherein each plurality of support mounting bracket including two ends, and wherein the supporting "L" bracket includes a horizontal side adapted to support the network element chassis; sliding the support mounting bracket on a vertical side of the supporting "L" bracket based on positioning of the plurality of posts in the rack; connecting a plurality of rack mount brackets to one of the two ends; and connecting the plurality of rack mount brackets to holes in the plurality of posts on the rack. The rack can include one of two posts and four posts, and the plurality of rack mount brackets can be connected to the two ends based on a number of posts in the rack. The support system can be connected to the rack, the network element chassis can be placed on the horizontal side of the supporting "L" bracket, and the network element chassis can be connected to the posts. All the connecting steps and the sliding step can be performed without tools.

The supporting "L" bracket, the plurality of support mounting brackets, and the plurality of rack mount brackets can be connectable to one another to form a rectangular brick for transport of the support system. The rack mount brackets can include mounting posts which are adjustable based on hole spacing in the plurality of posts in the rack. The mounting posts can include a tapered pin and a square base, wherein the tapered pin can be adapted to engage a circular shaped hole in the plurality of posts with variable size, and the square base can be adapted to engage a cage nut hole in the plurality of posts. The plurality of support mounting brackets can be adjustable to the supporting "L" bracket based on a width of the plurality of posts in the rack. The rack can include any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

In a further exemplary embodiment, a support system toolkit for a single person installation of a network element chassis in a rack with a plurality of posts includes two supporting "L" brackets each including a horizontal side adapted to support the network element chassis and a vertical side; four support mounting brackets each including two ends and each slidably connectable to the vertical side of a supporting "L" bracket based on positioning of the plurality of posts in the rack; and four rack mount brackets each connectable to one of the two ends and adapted to connect to holes in a post on the rack. The rack can include any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, in various exemplary embodiments, the present disclosure relates to a network element chassis tool and method for a single person installation. The present disclosure includes a temporary and re-useable support system that quickly installs and holds a chassis in place during installation into either a 2-post or 4-post equipment rack. The temporary support system is adapted to work in industry-standard 19 inch, 23 inch, European Telecommunications Standards Institute (ETSI) racks, and the like. That is, the support system is configured to work across different types of racks, thereby enabling an installation person to carry a single support system for any type of rack. The support system includes a support bracket, support mounting brackets, tack mount brackets, and hardware. The support system allows any chassis to be installed in a rack by a single installer instead of having to deploy two installers for each installation. Advantageously, the support system can be deployed in all known telecom/equipment racks, provides quick assembly/disassembly to a rack without the use of tools, and is designed for easy transport, e.g., in a toolbox or installers travel or toolkit.

The support system mounts to the rack using opposing front and rear pins for alignment and retention, supporting tool-less connectivity and front access deployment. The support system includes reversible mounting brackets and detachable/reversible adapter plates to support all known frame types and upright depths. The support system can be formed with light gauge steel and assembles into a small form factor for portability. The support system offers an advantage and/or cost savings by facilitating single person installation where otherwise two people (and travel costs) would be required. This also simplified logistics which is further simplified since the tool supports all rack types and is portable.

Figures 1, 2:
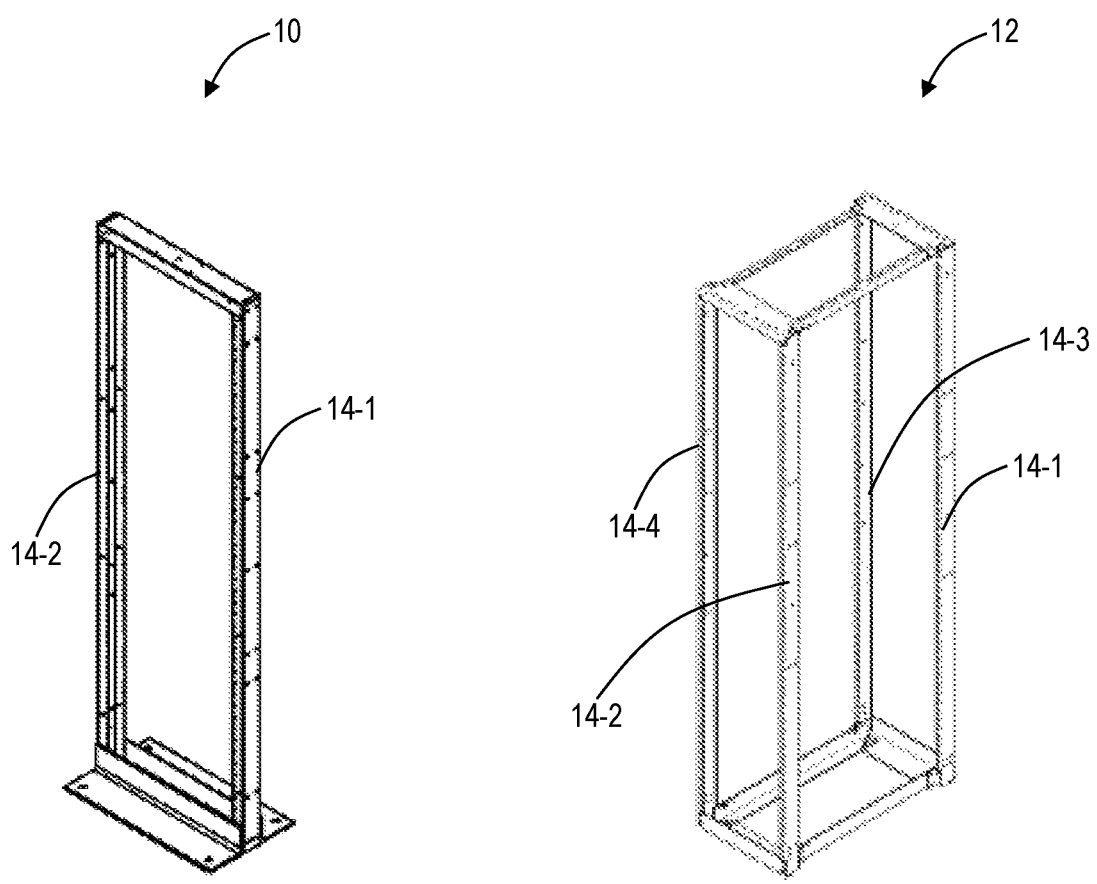
FIGS. 1 and 2 are perspective diagrams of a two-post rack (FIG. 1) and a four-post rack (FIG. 2) for use with the support system enabling single person installation of a chassis.

Referring to FIGS. 1 and 2, in an exemplary embodiment, perspective diagrams illustrate a two-post rack 10 (FIG. 1) and a four-post rack 12 (FIG. 2) for use with the support system enabling single person installation of a chassis. The chassis and support system are not illustrated in FIGS. 1 and 2. The racks 10, 12 can include a 19-inch rack, a 23-inch rack, an ETSI rack, an Electronic Industries Alliance (EIA) rack, a Consumer Electronics Association (CEA) rack, an International Electrotechnical Commission (IEC) rack, a Western Electric Company (WECO) rack, or the like. The chassis is installed by mounting the chassis to posts 14 of the racks 10, 12. As is described herein, the support system is adapted to work on either of the racks 10, 12, i.e., to connect to two posts 14-1, 14-2 or four posts 14-1, 14-2, 14-3, 14-4.

Figure 3:
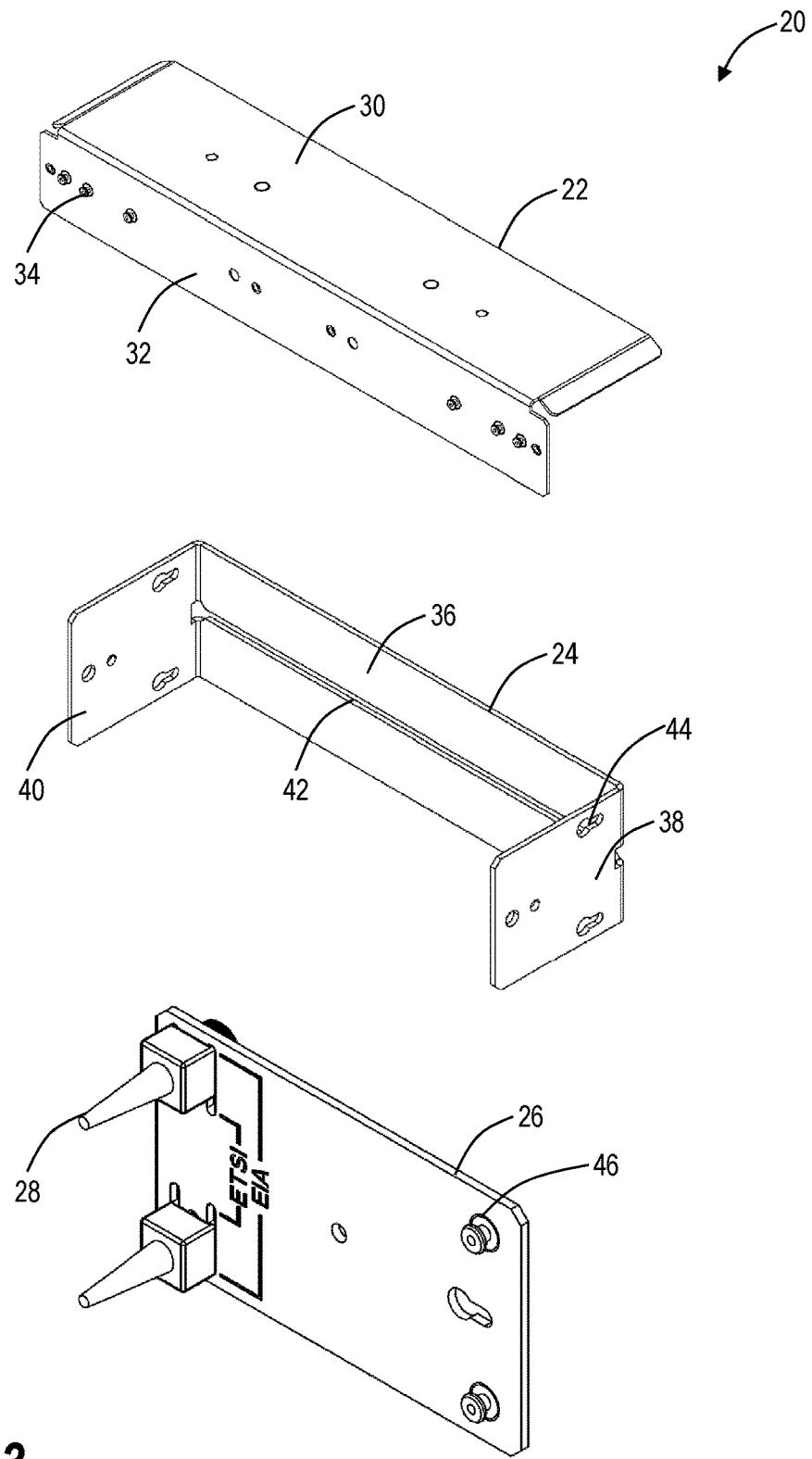
FIG. 3 is a perspective diagram of various components associated with a support system which can connect to the racks of FIGS. 1 and 2 to support single person installation of a chassis.

Referring to FIG. 3, in an exemplary embodiment, a perspective diagram illustrates various components associated with a support system 20 which can connect to the racks 10, 12 to support single person installation of a chassis. The support system 20 is a configurable kit which is configured to connect to the two posts 14-1, 14-2 or the four posts 14-1, 14-2, 14-3, 14-4, without tools. Once connected, the support system 20 can support a chassis on the rack 10, 12 while an installer physically connects the chassis to the posts 14. Once the chassis is mounted to the posts 14, the support system 20 is removed. The support system 20 includes supporting "L" brackets 22, support mounting brackets 24, and rack mount brackets 26 with mounting posts 28, each is common for all applications (types of the racks 10, 12).

A kit for the support system 20 to connect to the posts 14 in the racks 10, 12 includes two of the supporting "L" brackets 22, one for each side (left and right) of the racks 10, 12. The supporting "L" brackets 22 include a horizontal side 30 and a vertical side 32. The supporting "L" brackets 22 are configured to support the chassis via the horizontal side 30 once the support system 20 is connected to the rack 10, 12. The vertical side 32 includes various keyhole inserts 34 for physical connection to the support mounting brackets 24.

Specifically, the support mounting brackets 24 connect to the vertical side 32 to support the supporting "L" brackets 22 via the posts 14.

The kit further includes four of the support mounting brackets 24 which are configured to connect to the posts 14 and the supporting "L" brackets 22. The support mounting brackets 24 include a vertical side 36 and two ends 38, 40 adjacent to the vertical side 36. The vertical side 36 includes a keyhole slot 42 adapted to receive the keyhole inserts 34 on the vertical side 32 of the supporting "L" brackets 22. The ends 38, 40 includes keyhole slots 44 for connectivity to the rack mount brackets 26.

The kit further includes four of the rack mount brackets 26. The rack mount brackets 26 are configured to connect to the posts 14, on either of the racks 10, 12, and the support mounting brackets 24. The rack mount brackets 26 include keyhole inserts 46 configured to connect to the keyhole slots 44. The rack mount brackets 26 further include the mounting posts 28 which are adjustable based on the type of the racks 10, 12, e.g., the mounting posts 28 can be adjustable for EIA, ETSI, etc. racks.

Note, various racks 10, 12 deployed in the field can either have two posts 14-1, 14-2 or four posts 14-1, 14-2, 14-3, 14-4, but the post 14 spacing can be variable. Also, the post 14 width can be variable as well. Thus, one objective of the support system 20 described herein is to provide reconfigurability to support variability in both post 14 spacing and post 14 width, all in the same support system 20 which is configurable, in the field, by a single installer, without tools. This reconfigurability is described as follows.

In an exemplary embodiment, the support system 20 for a single person installation of a network element chassis in the rack 10, 12 with the plurality of posts 14 includes a plurality of supporting "L" brackets 22 each including a horizontal side 30 adapted to support the network element chassis and a vertical side 32; a plurality of support mounting brackets 24 each including two ends 38, 40 and each slidably connectable to the vertical side 32 of a supporting "L" bracket 22 based on positioning of the plurality of posts 14 in the rack 10, 12; and a plurality of rack mount brackets 26 each connectable to one of the two ends 38, 40 and adapted to connect to holes in a post on the rack. The rack 10, 12 can include one of two posts and four posts and the plurality of rack mount brackets 26 are connected to the two ends 38, 4-based on a number of posts 14 in the rack 10, 12.

Figure 4:
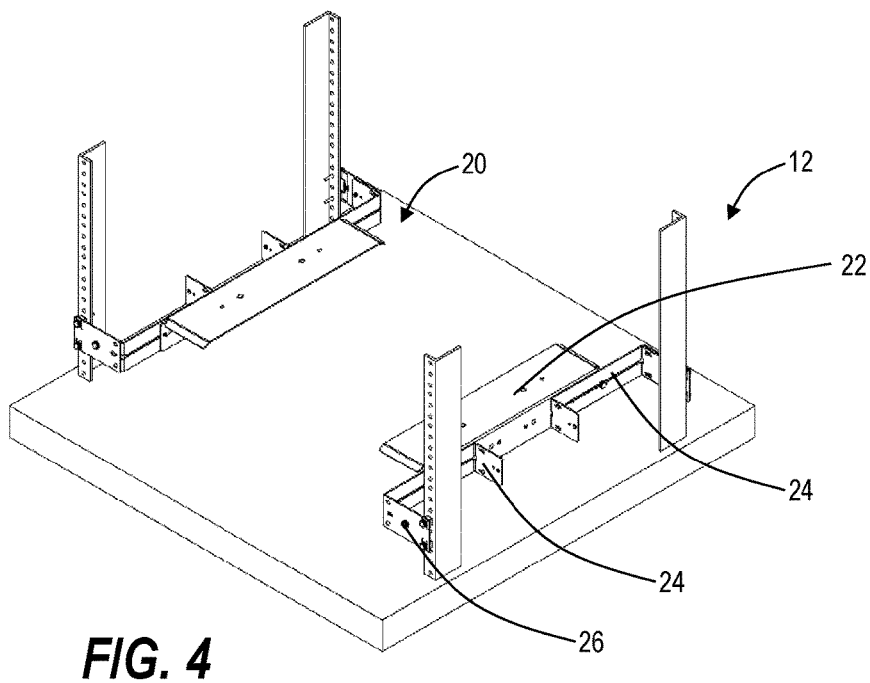
FIGS. 4 and 5 are perspective diagrams of the support system of FIG. 3 installed in the four-post rack (FIG. 4) of FIG. 1 and supporting a chassis for installation thereof (FIG. 5)
Figure 5:
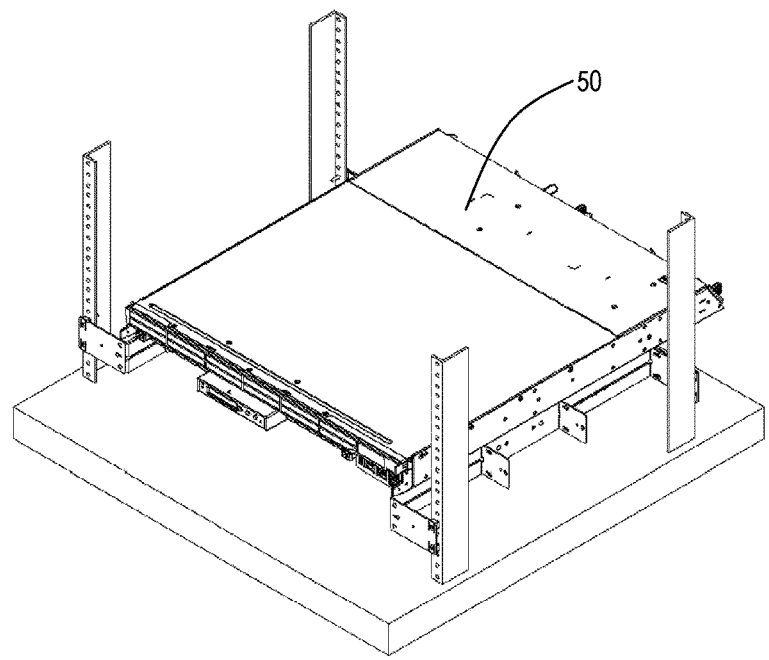

Referring to FIGS. 4 and 5, the support system 20 is connected to the rack 10, 12, a network element chassis 50 is placed on the horizontal side 30 of each of the plurality of supporting "L" brackets 22, and the network element chassis is connected to the posts 14. All connections between the plurality of supporting "L" brackets 22, the plurality of support mounting brackets 24, the plurality of rack mount brackets 26, and the rack 10, 12 are performed without tools. The plurality of supporting "L" brackets 22, the plurality of support mounting brackets 24, and the plurality of rack mount brackets 26 are connectable to one another to form a rectangular brick for transport of the support system 20.

Figure 6:
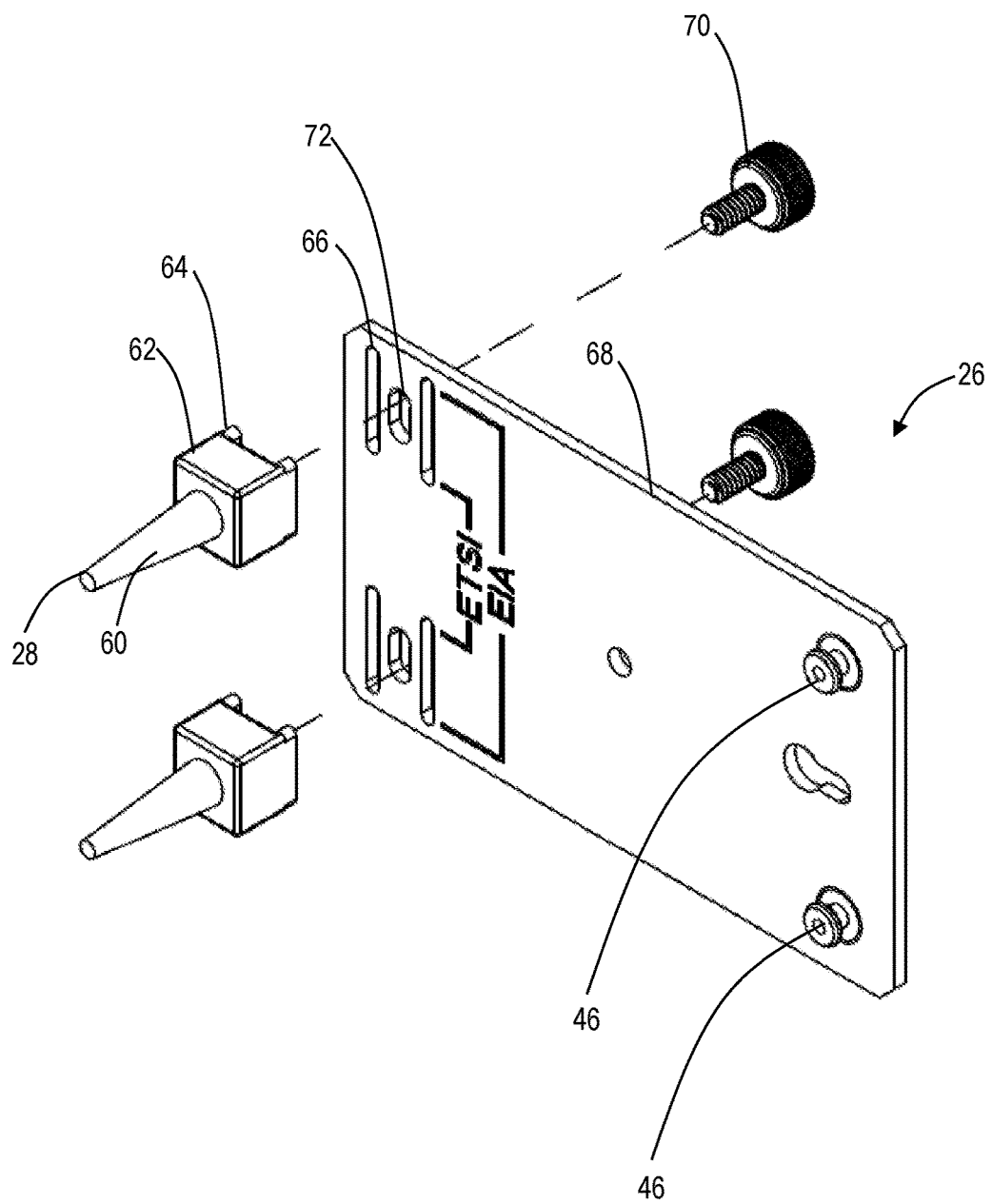
FIGS. 6, 7, and 8 are perspective diagrams of the rack mount brackets of the support system of FIG. 3 illustrating reconfigurability for different hole spacings on the posts in the racks of FIGS. 1 and 2.

Referring to FIG. 6, the rack mount brackets 26 can include mounting posts 28 which are adjustable based on hole spacing in the plurality of posts 14 in the rack 10, 12. The mounting posts 28 include a tapered pin 60 and a square base 62, wherein the tapered pin 60 is adapted to engage a circular shaped hole in the plurality of posts 14 with variable size and the square base is adapted to engage a cage nut hole in the plurality of posts 14. The plurality of support mounting brackets 24 are adjustable to the supporting "L" bracket 22 based on a width of the plurality of posts 14 in the rack 10, 12. The rack 10, 12 can include any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

Referring back to FIGS. 4 and 5, in an exemplary embodiment, perspective diagrams illustrate the support system 20 installed in the four-post rack 12 (FIG. 4) and supporting a chassis 50 for installation thereof (FIG. 5). FIG. 4 shows the support system 12 connected to the posts 14-1, 14-2, 14-3, 14-4 of the rack 12. The supporting "L" brackets 22 are connected to the support mounting brackets 24 and the support mounting brackets 24 are connected to the posts 14-1, 14-2, 14-3, 14-4 via the rack mount brackets 26. The support system 20 supports mounting to the rack 12 using pins and is clamped in place with the adjustable brackets, the support mounting brackets 24. In FIG. 5, the chassis 50 can be placed on the support system 20, i.e., on top of the supporting "L" brackets 22, and is ready for mounting to the rack 12, via the posts 14-1, 14-2, 14-3, 14-4.

Figure 7:
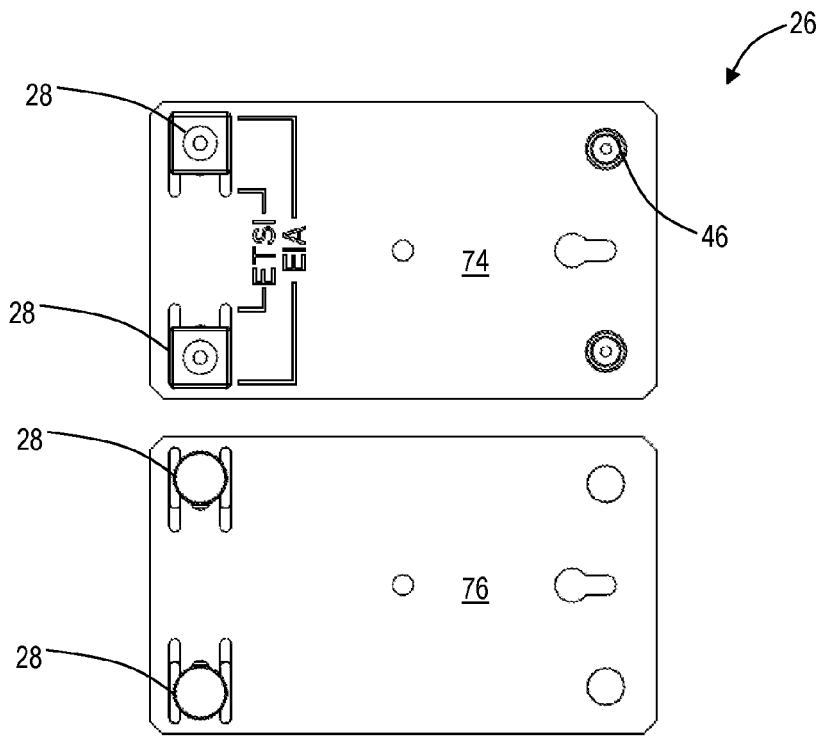
Figure 8:
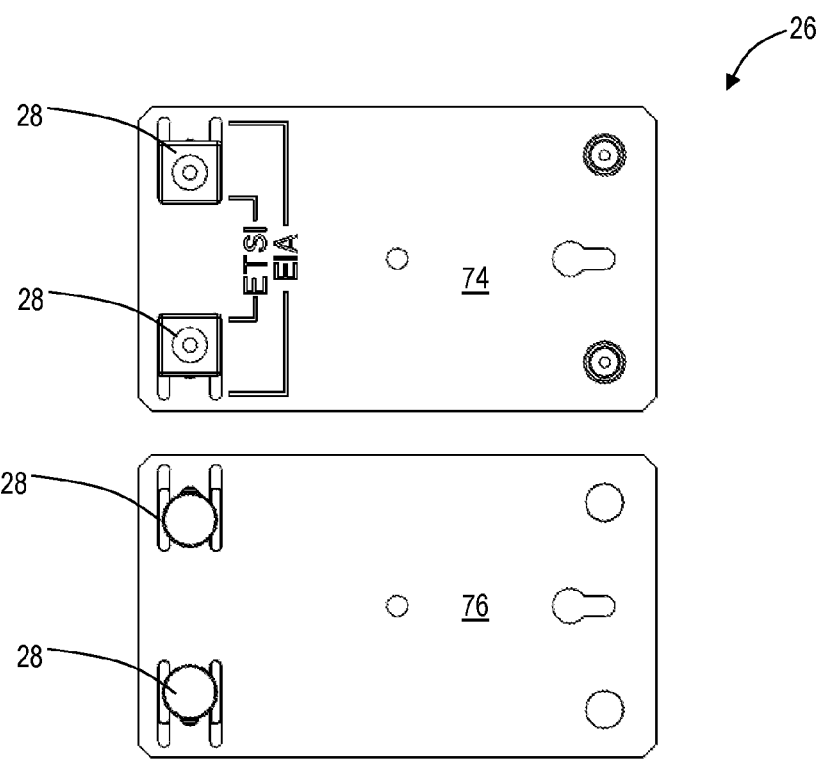

Referring to FIGS. 6, 7, and 8, in exemplary embodiments, perspective diagrams illustrate the rack mount brackets 26 and reconfigurability for different hole spacings on the posts 14 in the racks 10, 12. FIG. 6 illustrates how the mounting posts 28 are connected to the rack mount brackets 26. The mounting posts 28 are configured to connect to holes in the posts 14. The mounting posts 28 include a tapered pin 60 configured to fit in different sized holes, squares, etc. Specifically, the tapered pin 60 is insertable into the holes and supports different sizes based on the tapered pin 60. The mounting posts 28 also include a base 62 with slot inserts 64. The base 62 is coupled to the tapered pin 60 and the slot inserts 64 are configured to fit into slots 66 in a plate 68 associated with the rack mount brackets 26. A thumb screw 70 fits through a hole 72 in the plate 68 and is insertable into a thread in the base 62 to hold the mounting posts 28 to the plate 68.

The mounting posts 28 are adjustable relative to the plate 68, based on positioning in the slots 66. FIGS. 7 and 8 illustrate two sides 74, 76 of the rack mount brackets 26 with the mounting posts 28 adjusted for an EIA rack (FIG. 7) and for an ETSI rack (FIG. 8). Note, the mounting posts 28 are adjustable for different hole spacings in the racks 10, 12 without tools, i.e., removing the thumb screw 70, adjusting the base 62 in the slots 66, and tightening the thumb screw 70. Each of the foregoing can be performed by hand.

Figure 9:
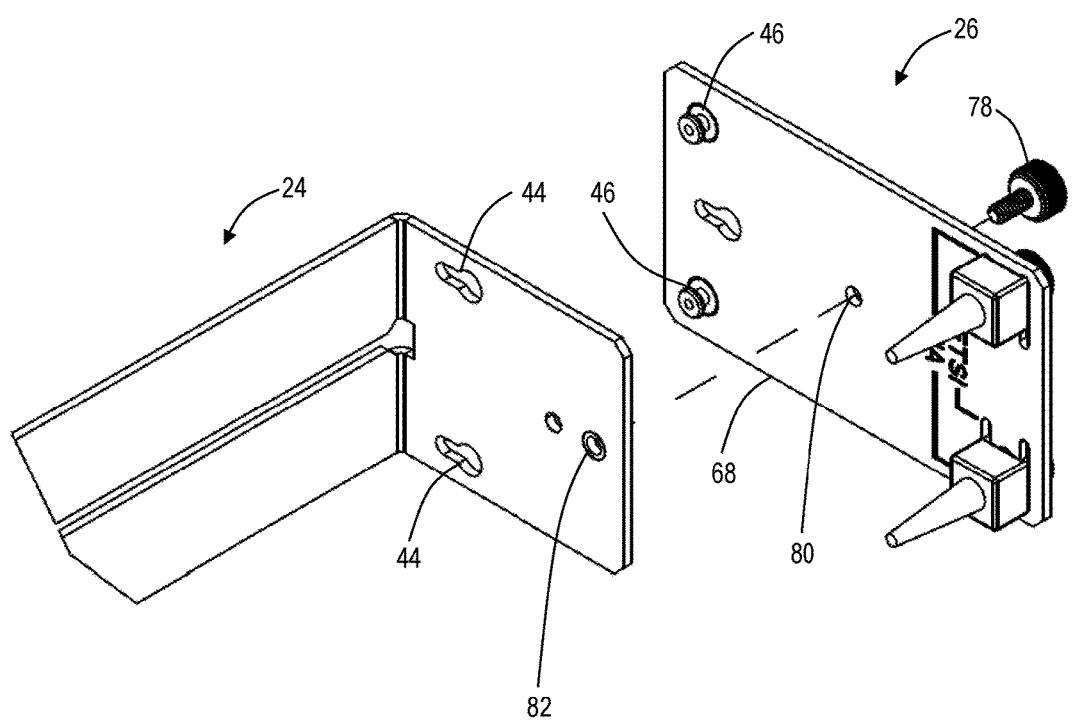
FIG. 9 is a perspective diagram of connectivity of the rack mount brackets of the support system of FIG. 3 to the ends of the support mounting brackets of the support system of FIG. 3.

Referring to FIG. 9, in an exemplary embodiment, a perspective diagram illustrates connectivity of the rack mount brackets 26 to the ends 38, 40 of the support mounting brackets 24. Again, the keyhole inserts 46 (e.g., a swage nut or the like) on the rack mount brackets 26 can be connected to the keyhole slots 44. Subsequently, a thumb screw 78 can secure the rack-mount bracket 26 to the support mounting bracket 24 via a hole 80 in the plate 68 and threads 82 in the ends 38, 40.

Figure 10:
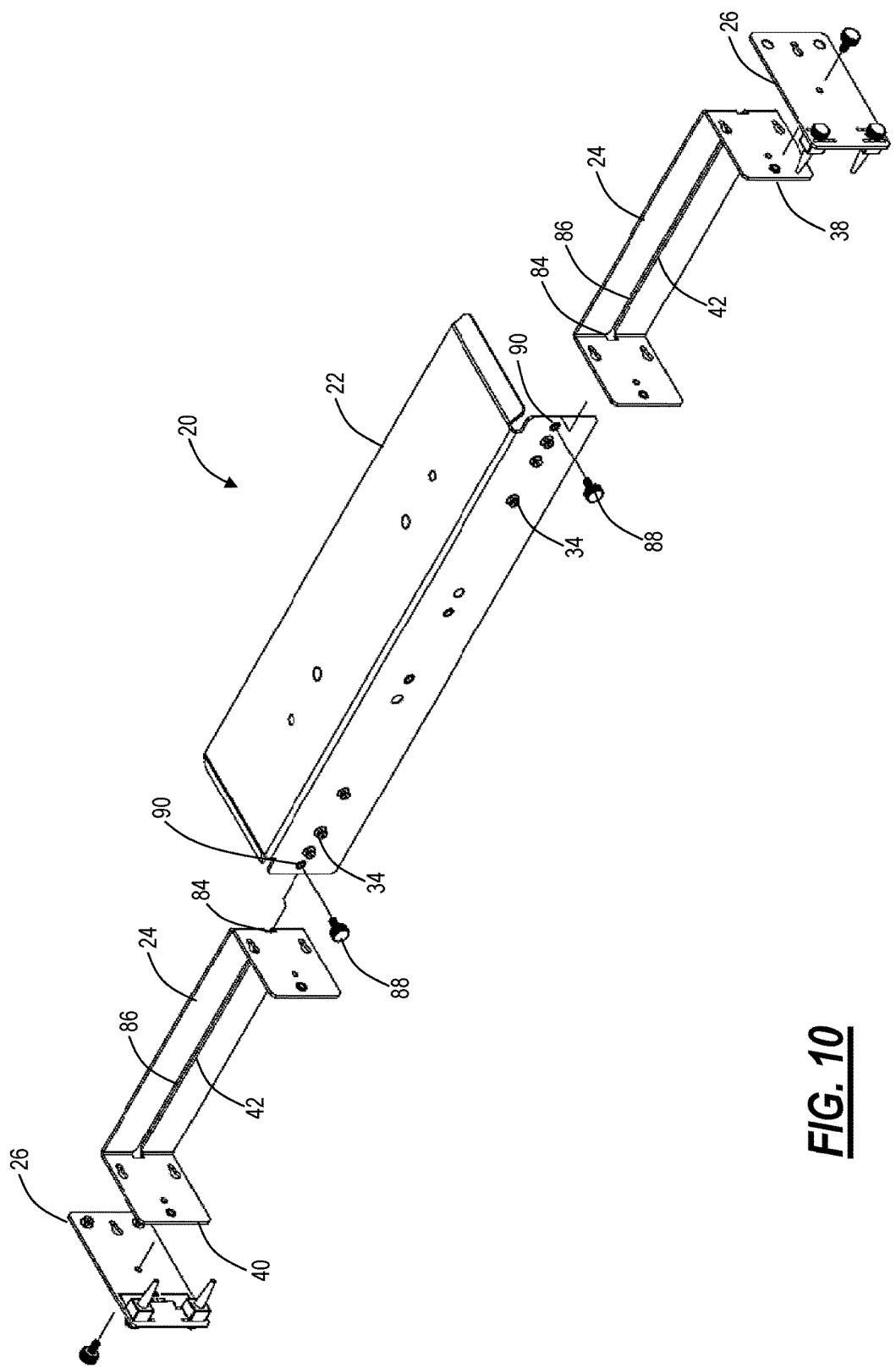
FIG. 10 is a perspective diagram of connectivity of all components in the support system of FIG. 3 for connectivity to the four-post rack of FIG. 1.

Referring to FIG. 10, in an exemplary embodiment, a perspective diagram illustrates connectivity of all components in the support system 20 for connectivity to the four-post rack 12. Again, the rack mount brackets 26 connect to the ends 38, 40 of the support mounting brackets 24 as described above in FIG. 9. The slot 42 in the support mounting brackets 24 engage the keyhole inserts 34 (e.g., swage nuts or the like) in the supporting "L" brackets 22. Specifically, the slot 42 includes a wide opening 84 for receiving the keyhole inserts 34. Once engaged through the wide opening 84, the keyhole inserts 34 are slidably engaged to a narrow channel 86 which runs the length of the support mounting brackets 24. The narrow channel 86 allows the support mounting brackets 24 to be positioned at various positions to account for variable post 14 spacing in the racks 10, 12.

Also, the supporting "L" brackets 22 can include multiple keyhole inserts 34 to provide additional support, e.g., three on each side. Once the support mounting brackets 24 are positioned appropriately based on the variable post 14 spacing, a thumb screw 88 can be inserted through a hole 90 in the supporting "L" brackets 22 to keep the support mounting brackets 24 in place relative to the supporting "L" brackets 22.

The support system 20 has the rack mount brackets 26 oriented for four posts 14, i.e., the rack mount brackets 26 are coupled to the outer ends 38, 40 of the support mounting brackets 24. For a two post 14 configuration, the same components are used with the rack mount brackets 26 coupled to the inner ends 38, 40 (not shown in FIG. 10).

Figure 11:
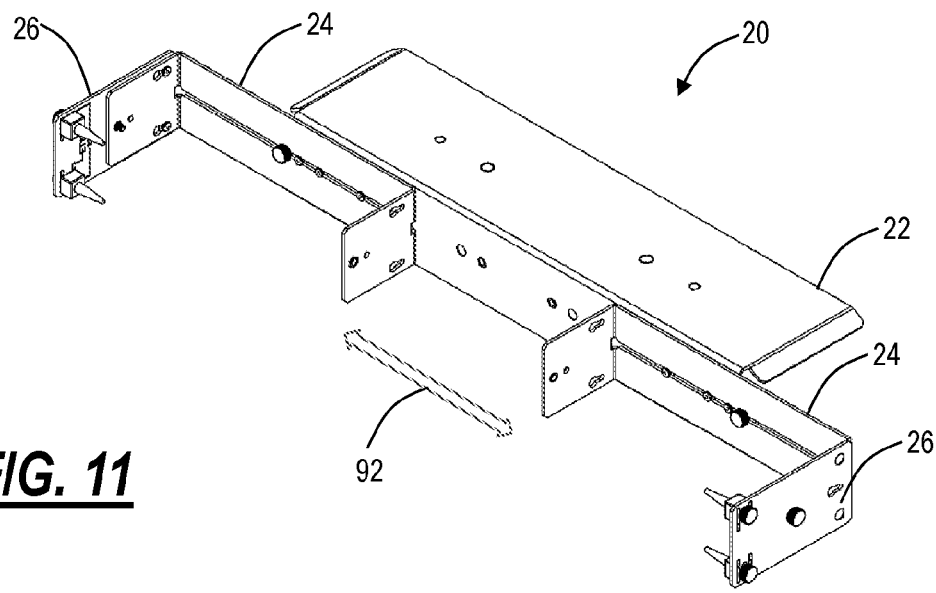
FIGS. 11 and 12 are perspective diagrams of reconfigurability of the support mounting brackets in the support system of FIG. 3 relative to the supporting "L" brackets in the support system of FIG. 3 to support variability in the posts of the racks of FIGS. 1 and 2.
Figure 12:
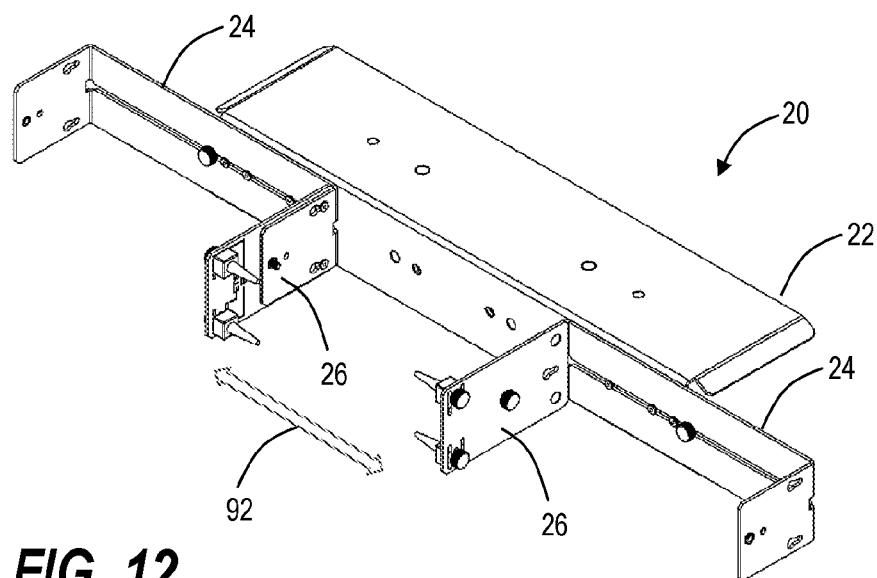

Referring to FIGS. 11 and 12, in an exemplary embodiment, perspective diagrams illustrate reconfigurability of the support mounting brackets 24 relative to the supporting "L" brackets 22 to support variability in the posts 14 of the racks 10, 12. FIG. 11 illustrates the support system 20 in a four-post configuration for the four-post rack 12. FIG. 12 illustrates the support system 20 in a two-post configuration for the two-post rack 10. Note, the configuration of the support mounting brackets 24 and the supporting "L" brackets 22 with the rack mount brackets 26 changed from FIG. 11 to FIG. 12 to change from the four-post configuration to the two-post configuration. Note, in both the configurations of FIGS. 11 and 12, the support mounting brackets 24 are adjustable based on slidable movement 92 to support variability in the racks 10, 12, i.e., post 14 size, width, position, etc.

Figure 13:
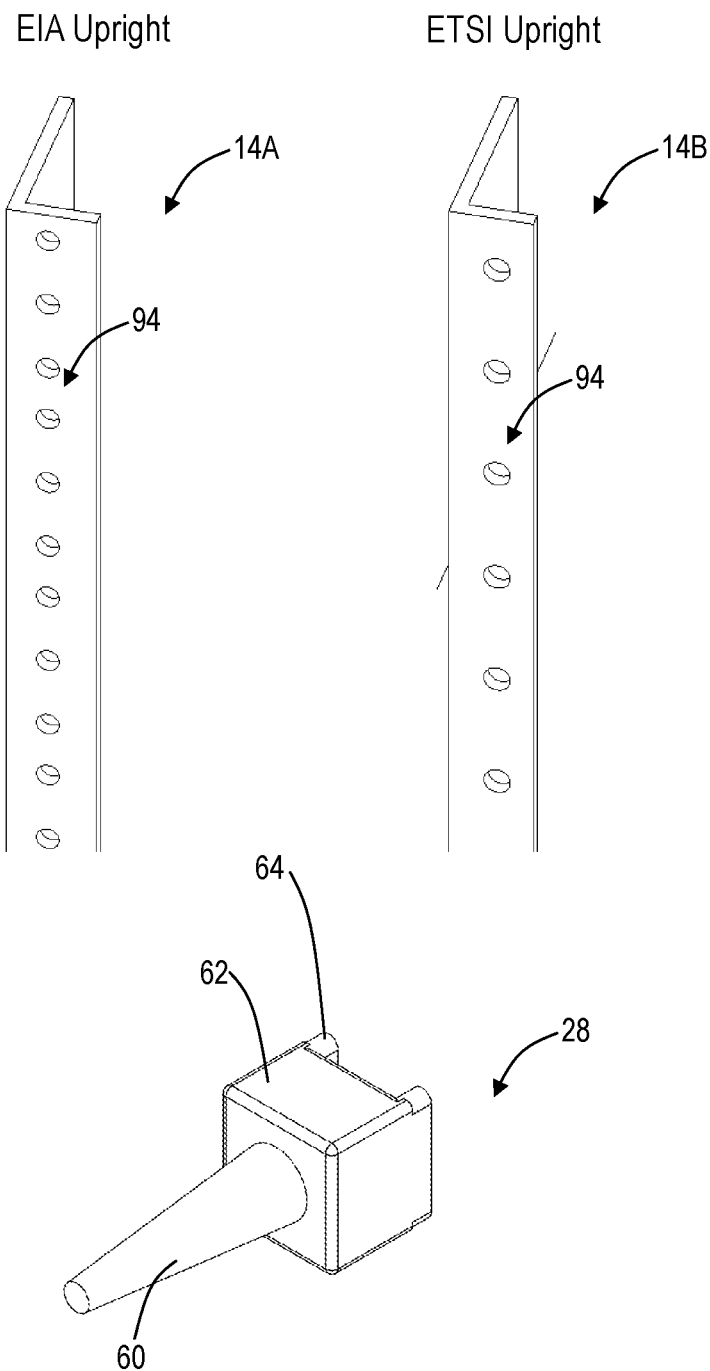
FIG. 13 is a diagram of various posts in EIA and ETSI racks of FIGS. 1 and 2 and the mounting posts in the support system of FIG. 3 support for all variants.

Referring to FIG. 13, in an exemplary embodiment, a diagram illustrates various posts 14A, 14B in EIA and ETSI racks 10, 12 and the mounting posts 28 support for all variants. The post 14A illustrates holes 94 for an EIA rack, and the post 14B illustrates holes 94 for an ETSI rack. Again, as described in FIGS. 6, 7, and 8, the mounting posts 28 can adjust to the plate 68 of the rack mount brackets 26 to support the different hole spacing for the posts 14A, 14B. The tapered pin 60 is used to support different sizes for the holes 94.

Figure 14:
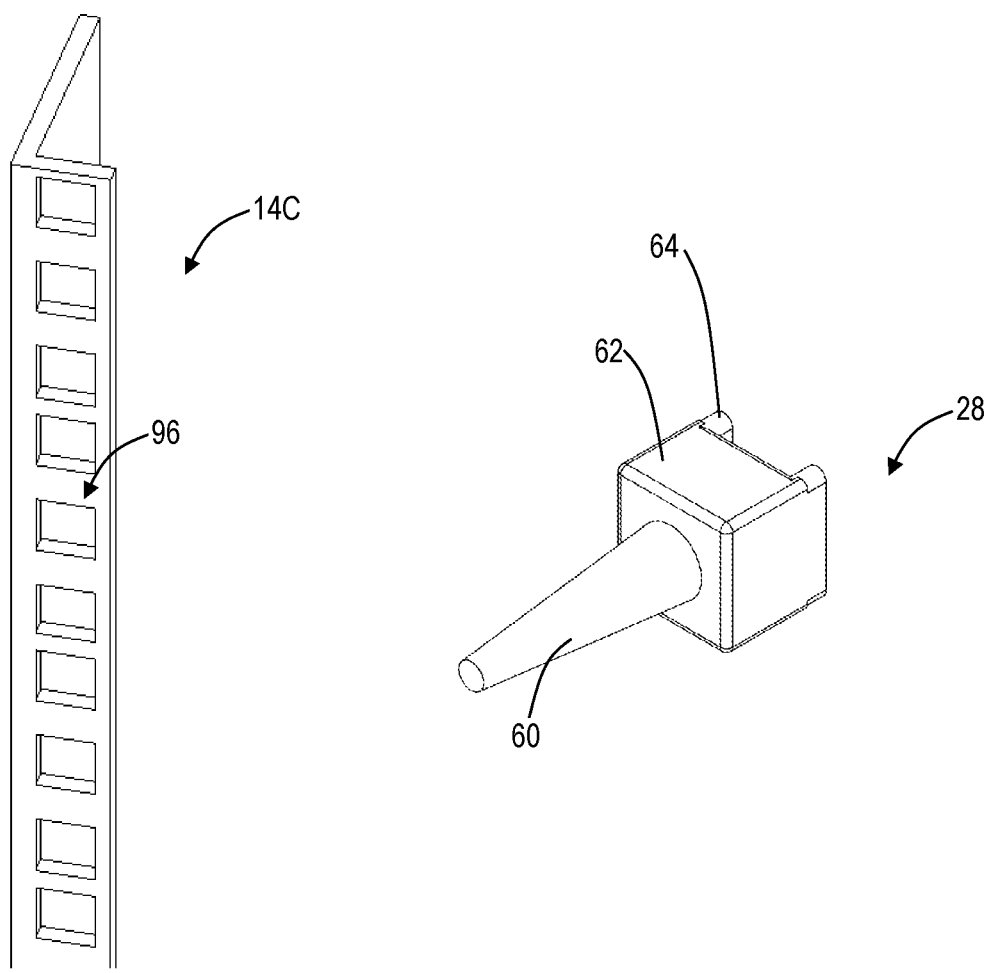
FIG. 14 is a diagram of a post in a cage nut rack of FIGS. 1 and 2 and the mounting posts in the support system of FIG. 3 in this variant.

Referring to FIG. 14, in an exemplary embodiment, a diagram illustrates a post 14C in a cage nut rack 10, 12 and the mounting posts 28 support for this variant. The cage nut rack 10, 12 has square holes 96, such as 9.5 mm square holes, which are the same size for EIA and ETSI, but with the different spacing. Here, the base 62 is sized to fit in the square holes 96. Thus, the mounting posts 28 can be positioned based on the ETSI or EIA spacing, and the base 62 supports the mounting posts 28 instead of the tapered pin 60 in the square holes 96.

Figure 15:
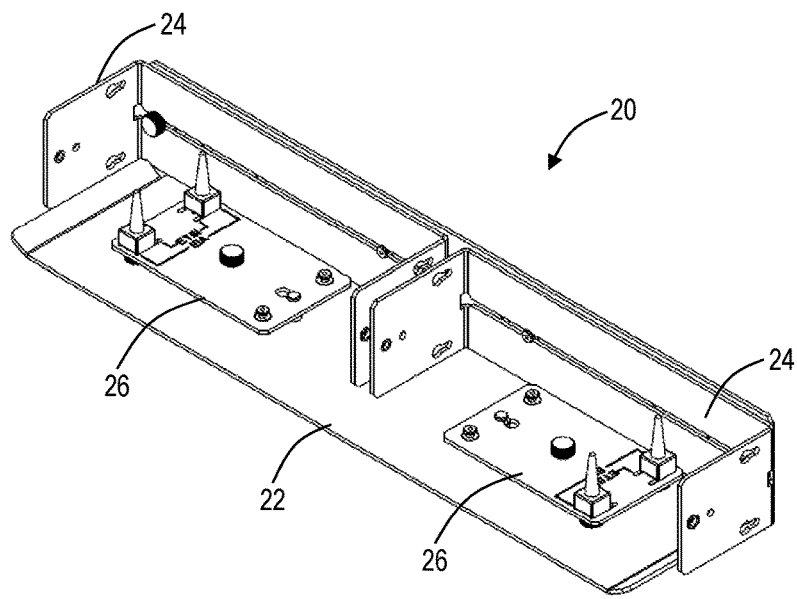
FIGS. 15 and 16 are perspective diagrams of different views of the support system of FIG. 3 packaged for transport.
Figure 16:
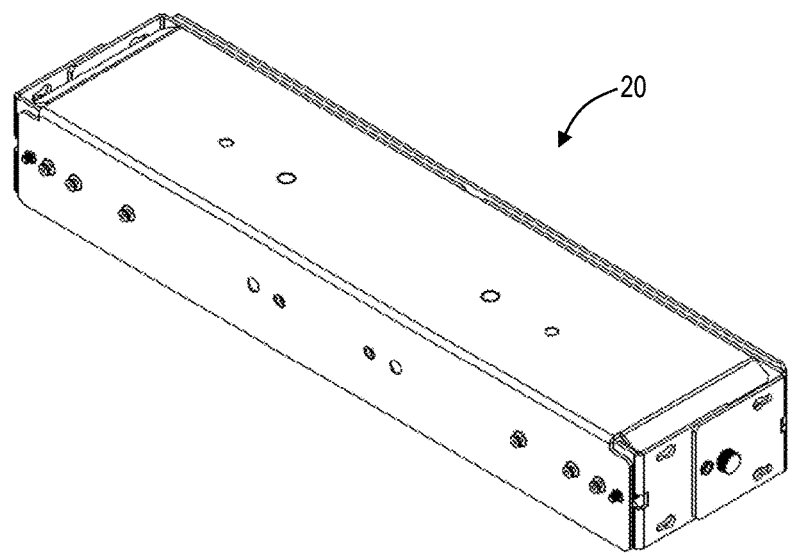

Referring to FIGS. 15 and 16, in an exemplary embodiment, perspective diagrams illustrate different views of the support system 20 packaged for transport. FIG. 15 illustrates one-half of the kit of the support system 20 assembled for transport. Here, the rack mount brackets 26 are connected to the bottom of the horizontal side 30 of the supporting "L" bracket 22. The support mounting brackets 24 are flipped and assembled to the supporting "L" bracket 22. FIG. 16 illustrates a combination of both sides of the kit of the support system 20 to form a rectangular "brick" which is compact and ready for transport.

Figure 17:
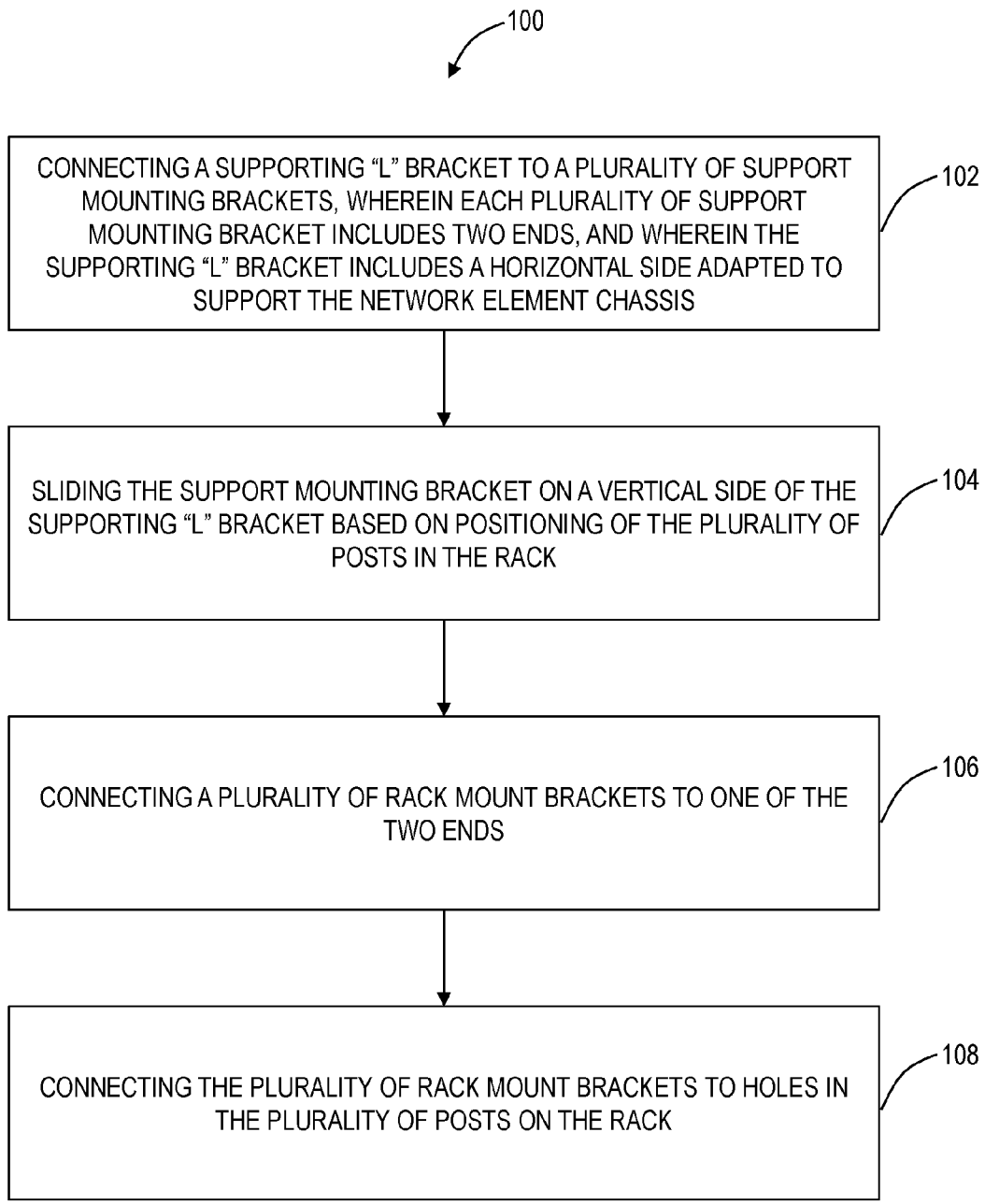
FIG. 17 is a flowchart of a process using the support system of FIG. 3 for a single person installation of a network element chassis in a rack with a plurality of posts.

Referring to FIG. 17, in an exemplary embodiment, a flowchart illustrates a process 100 using the support system 20 for a single person installation of a network element chassis in a rack with a plurality of posts. The process 100 includes connecting a supporting "L" bracket to a plurality of support mounting brackets, wherein each plurality of support mounting bracket includes two ends, and wherein the supporting "L" bracket includes a horizontal side adapted to support the network element chassis (step 102); sliding the support mounting bracket on a vertical side of the supporting "L" bracket based on positioning of the plurality of posts in the rack (step 104); connecting a plurality of rack mount brackets to one of the two ends (step 106); and connecting the plurality of rack mount brackets to holes in the plurality of posts on the rack (step 108). The rack can include one of two posts and four posts, and the plurality of rack mount brackets are connected to the two ends based on a number of posts in the rack.

The support system is connected to the rack, the network element chassis is placed on the horizontal side of the supporting "L" bracket, and the network element chassis is connected to the posts. All steps 102-108 are performed without tools. The supporting "L" bracket, the plurality of support mounting brackets, and the plurality of rack mount brackets can be connectable to one another to form a rectangular brick for transport of the support system. The rack mount brackets can include mounting posts which are adjustable based on hole spacing in the plurality of posts in the rack. The mounting posts can include a tapered pin and a square base, wherein the tapered pin is adapted to engage a circular shaped hole in the plurality of posts with variable size, and the square base is adapted to engage a cage nut hole in the plurality of posts.

The plurality of support mounting brackets can be adjustable to the supporting "L" bracket based on a width of the plurality of posts in the rack. The rack can include any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

In another exemplary embodiment, a support system toolkit for a single person installation of a network element chassis in a rack with a plurality of posts includes two supporting "L" brackets 22 each including a horizontal side 30 adapted to support the network element chassis and a vertical side 32; four support mounting brackets 24 each including two ends 38, 40 and each slidably connectable to the vertical side 32 of a supporting "L" bracket based 22 on positioning of the plurality of posts 14 in the rack 10, 12; and four rack mount brackets 26 each connectable to one of the two ends 38, 40 and adapted to connect to holes in a post 14 on the rack 10, 12. The rack 10, 12 can include any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A support system for a single person installation of a network element chassis in a rack with a plurality of posts, the support system comprising:
   a plurality of supporting "L" brackets each comprising a horizontal side adapted to support the network element chassis and a vertical side;
   a plurality of support mounting brackets each comprising two ends and each slidably connectable to the vertical side of an associated supporting "L" bracket of the plurality of supporting "L" brackets based on positioning of the plurality of posts in the rack; and
   a plurality of rack mount brackets each connectable to one of the two ends and adapted to connect to holes in a post on the rack;
   wherein the horizontal side of each of the plurality of supporting "L" brackets is disposed above the vertical side of each of the plurality of supporting "L" brackets such that the network element chassis is temporarily supported above the plurality of supporting "L" brackets, the plurality of support mounting brackets, and the plurality of rack mount brackets, and wherein the horizontal side of each of the plurality of supporting "L" brackets has a discrete length that terminates proximate an edge of the network element chassis; and
   wherein the rack mount brackets comprise mounting posts which are vertically adjustable via translation in associated slots in the rack mount brackets to accommodate hole spacing in the plurality of posts in the rack.

2. The support system of claim 1, wherein the support system is connected to the rack, the network element chassis is placed on the horizontal side of each of the plurality of supporting "L" brackets, and the network element chassis is connected to the posts.

3. The support system of claim 1, wherein all connections between the plurality of supporting "L" brackets, the plurality of support mounting brackets, the plurality of rack mount brackets, and the rack are performed without tools.

4. The support system of claim 1, wherein the plurality of supporting "L" brackets, the plurality of support mounting brackets, and the plurality of rack mount brackets are connectable to one another to form a rectangular brick for transport of the support system.

5. The support system of claim 1, wherein the mounting posts comprise a tapered pin and a square base, wherein the tapered pin is adapted to engage a circular shaped hole in the plurality of posts with variable size, and the square base is adapted to engage a cage nut hole in the plurality of posts.

6. The support system of claim 1, wherein the plurality of support mounting brackets are adjustable to the supporting "L" bracket based on a width of the plurality of posts in the rack.

7. The support system of claim 1, wherein the rack comprises any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

8. A method using a support system for a single person installation of a network element chassis in a rack with a plurality of posts, the method comprising:
   connecting a supporting "L" bracket to a plurality of support mounting brackets, wherein each plurality of support mounting bracket comprises two ends, and wherein the supporting "L" bracket comprises a horizontal side adapted to support the network element chassis;
   sliding the support mounting bracket on a vertical side of the supporting "L" bracket based on positioning of the plurality of posts in the rack;
   connecting a plurality of rack mount brackets to one of the two ends; and
   connecting the plurality of rack mount brackets to holes in the plurality of posts on the rack;
   wherein the horizontal side of the supporting "L" bracket is disposed above the vertical side of the supporting "L" bracket such that the network element chassis is temporarily supported above the supporting "L" bracket, the plurality of support mounting brackets, and the plurality of rack mount brackets, and wherein the horizontal side of the supporting "L" bracket has a discrete length that terminates proximate an edge of the network element chassis; and
   wherein the rack mount brackets comprise mounting posts which are vertically adjustable via translation in associated slots in the rack mount brackets to accommodate hole spacing in the plurality of posts in the rack.

9. The method of claim 8, wherein the support system is connected to the rack, the network element chassis is placed on the horizontal side of the supporting "L" bracket, and the network element chassis is connected to the posts.

10. The method of claim 8, wherein all the connecting steps and the sliding step are performed without tools.

11. The method of claim 8, wherein the supporting "L" bracket, the plurality of support mounting brackets, and the plurality of rack mount brackets are connectable to one another to form a rectangular brick for transport of the support system.

12. The method of claim 8, wherein the mounting posts comprise a tapered pin and a square base, wherein the tapered pin is adapted to engage a circular shaped hole in the plurality of posts with variable size, and the square base is adapted to engage a cage nut hole in the plurality of posts.

13. The method of claim 8, wherein the plurality of support mounting brackets are adjustable to the supporting "L" bracket based on a width of the plurality of posts in the rack.

14. The method of claim 8, wherein the rack comprises any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

15. A support system toolkit for a single person installation of a network element chassis in a rack with a plurality of posts, the support system comprising:
   two supporting "L" brackets each comprising a horizontal side adapted to support the network element chassis and a vertical side;
   four support mounting brackets each comprising two ends and each slidably connectable to the vertical side of an associated supporting "L" bracket of the two supporting "L" brackets based on positioning of the plurality of posts in the rack; and
   four rack mount brackets each connectable to one of the two ends and adapted to connect to holes in a post on the rack;
   wherein the horizontal side of each of the supporting "L" brackets is disposed above the vertical side of each of the supporting "L" brackets such that the network element chassis is temporarily supported above the supporting "L" brackets, the support mounting brackets, and the rack mount brackets, and wherein the horizontal side of each of the supporting "L" brackets has a discrete length that terminates proximate an edge of the network element chassis; and wherein the rack mount brackets comprise mounting posts which are vertically adjustable via translation in associated slots in the rack mount brackets to accommodate hole spacing in the plurality of posts in the rack.

16. The support system toolkit of claim 15, wherein the rack comprises any of a 19-inch rack, a 23-inch rack, an ETSI rack, an Electronic Industries Alliance (EIA) rack, a Consumer Electronics Association (CEA) rack, an International Electrotechnical Commission (IEC) rack, and a Western Electric Company (WECO) rack.

* * * * *